(12) United States Patent
Lee et al.

(10) Patent No.: US 8,043,942 B2
(45) Date of Patent: Oct. 25, 2011

(54) METHOD FOR PRODUCING CORE-SHELL NANOWIRES, NANOWIRES PRODUCED BY THE METHOD AND NANOWIRE DEVICE COMPRISING THE NANOWIRES

(75) Inventors: Eun Kyung Lee, Suwon-si (KR); Jai Yong Han, Suwon-si (KR); Byoung Lyong Choi, Seoul (KR); Kyung Sang Cho, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 1028 days.

(21) Appl. No.: 11/932,953

(22) Filed: Oct. 31, 2007

(65) Prior Publication Data

US 2010/0327258 A1 Dec. 30, 2010

(30) Foreign Application Priority Data

Jul. 5, 2007 (KR) .................. 10-2007-0067549

(51) Int. Cl.
*H01L 21/00* (2006.01)

(52) U.S. Cl. ........ 438/478; 438/487; 438/689; 438/758; 257/9; 257/13; 257/21; 257/347; 257/441; 257/E21.106; 257/E21.131; 257/E21.409; 257/E29.107; 257/E29.168; 257/E51.038; 257/E51.041; 977/742; 977/762; 977/891; 977/936

(58) Field of Classification Search .................. 257/347, 257/440, 441, 461, 465, 466, E21.106, 131, 257/132, 409, 29.107, 255, 51.038, 40, 9, 257/13, 15, 21, 24, E21.09, 29.168, 33.008; 438/478–487, 510, 514, 689, 758, 800; 977/700, 977/742–745, 762, 813, 936, 891
See application file for complete search history.

(56) References Cited

U.S. PATENT DOCUMENTS

| | | | | |
|---|---|---|---|---|
| 6,878,871 | B2 * | 4/2005 | Scher et al. | 136/252 |
| 7,087,832 | B2 * | 8/2006 | Scher et al. | 136/250 |
| 7,273,732 | B2 * | 9/2007 | Pan et al. | 435/99 |
| 7,276,424 | B2 * | 10/2007 | Wei | 438/406 |
| 7,295,419 | B2 * | 11/2007 | Chow et al. | 361/303 |
| 7,344,961 | B2 * | 3/2008 | Romano et al. | 438/478 |
| 7,354,850 | B2 * | 4/2008 | Seifert et al. | 438/604 |
| 7,365,395 | B2 * | 4/2008 | Stumbo et al. | 257/347 |
| 7,521,274 | B2 * | 4/2009 | Hersee et al. | 438/41 |
| 7,718,995 | B2 * | 5/2010 | Kawashima et al. | 257/24 |
| 7,727,855 | B2 * | 6/2010 | Wei | 438/406 |
| 7,741,197 | B1 * | 6/2010 | Duan et al. | 438/478 |
| 7,776,758 | B2 * | 8/2010 | Duan et al. | 438/758 |
| 2005/0064185 | A1 * | 3/2005 | Buretea et al. | 428/364 |
| 2007/0032091 | A1 * | 2/2007 | Heald et al. | 438/758 |
| 2009/0169828 | A1 * | 7/2009 | Hersee et al. | 428/172 |
| 2009/0236588 | A1 * | 9/2009 | Sharma et al. | 257/24 |
| 2010/0012921 | A1 * | 1/2010 | Kawashima et al. | 257/13 |
| 2010/0193015 | A1 * | 8/2010 | Cha et al. | 136/252 |
| 2011/0132002 | A1 * | 6/2011 | Lee et al. | 62/3.7 |

FOREIGN PATENT DOCUMENTS

KR 100809248 B1 2/2008

* cited by examiner

*Primary Examiner* — Michael Lebentritt
(74) *Attorney, Agent, or Firm* — Cantor Colburn LLP

(57) ABSTRACT

Disclosed is a method for producing core-shell nanowires in which an insulating film is previously patterned to block the contacts between nanowire cores and nanowire shells. According to the method, core-shell nanowires whose density and position is controllable can be produced in a simple manner. Further disclosed are nanowires produced by the method and a nanowire device comprising the nanowires. The use of the nanowires leads to an increase in the light emitting/ receiving area of the device. Therefore, the device exhibits high luminance/efficiency characteristics.

33 Claims, 7 Drawing Sheets

METHOD FOR PRODUCING CORE-SHELL NANOWIRES, NANOWIRES PRODUCED BY THE METHOD AND NANOWIRE DEVICE COMPRISING THE NANOWIRES

BACKGROUND OF THE INVENTION

This non-provisional application claims priority under 35 U.S.C.§119 to Korean Patent Application No. 10-2007-0067549, filed on Jul. 5, 2007 in the Korean Intellectual Property Office (KIPO), the entire contents of which are herein incorporated by reference.

FIELD OF THE INVENTION

Example embodiments relate to a method for producing core-shell nanowires, core-shell nanowires produced by the method, and a nanowire device comprising the core-shell nanowires. Other example embodiments relate to a method for producing core-shell nanowires whose density and position is controllable by using a previously patterned insulating film to block the contacts between nanowire cores and nanowire shells, nanowires produced by the method, and a nanowire device comprising the nanowires.

DESCRIPTION OF THE RELATED ART

Nanowires are linear materials whose diameter is in the nanometer range (1 nm=$10^{-9}$m) and whose length is much larger than the diameter. Nanowires have a length of several hundred nanometers or on the order of micrometers (1 µm=$10^{-6}$ m) or millimeters (1 mm=$10^{-3}$m). Nanowires exhibit various physical properties depending on their diameter and length.

Nanowires can be used to fabricate a variety of microdevices due to their small size, and have advantages in the utilization of their inherent electron mobility characteristics along specific directions and optical properties, such as polarization.

At present, extensive research on nanowires is actively underway in the nanotechnology field. Nanotechnology associated with the use of nanowires is a next-generation technology that is widely applied in a variety of industrial fields, including photonic devices (e.g., laser devices), transistors and memory devices. Silicon, zinc oxide, Group III-V semiconductor materials, e.g., gallium nitride as an optical semiconductor material, Group II-VI semiconductor materials, e.g., cadmium sulfide, etc. are currently used as materials for nanowires. The recent nanowire production technology has reached to a level that the length and width of nanowires is controllable. However, no satisfactory results are achieved in developing a technology to arrange nanowires at desired positions of substrates to fabricate devices.

Representative methods for the production of nanowires include chemical vapor deposition (CVD), laser ablation, template approach, and the like.

In recent years, much research has been conducted on methods for the production of core-shell nanowires. For example, U.S. Patent Publication No. 2006/0273328 discloses a method to fabricate a light emitting device, which comprises creating nanowire structures, each of which consists of a core and a shell, separating the nanowire structures from a substrate, depositing an electrode into contact with one side of the shell of the nanowire structures, removing a portion of the other side of the shell to expose a portion of the core, and depositing another electrode into contact with the exposed portion of the core. The light emitting device is shown in FIG. 1. The light emitting device is fabricated by creating nanowire structures, each of which consists of an n-GaN core 1120 and a p-GaN shell 1110, forming the core-shell nanowire structures into an oriented nanowire thin film, depositing a first electrode 1140 into contact with one side of the shell, etching a portion of the other side of the shell to expose a portion of the p-GaN core, and depositing a second electrode 1130 into contact with the exposed portion of the p-GaN core.

Korean Patent Unexamined Publication No. 2004-0090524 discloses multiple-walled ZnO-based nanowires and a production method thereof. Each of the nanowires consists of a ZnO nanowire core and a shell composed of a nitride semiconductor or a dielectric.

The prior art involves complicated processing steps, i.e. separation and arrangement of the nanowire structures, formation of electrodes on the nanowire structures and etching of the nanowire structures. Another drawback of the prior art is that the nanowire structures are arranged in a two-dimensional configuration, thus making it impossible to attain a three-dimensional vertical structure, which is an important advantage of nanowires.

SUMMARY OF THE INVENTION

Example embodiments are provided below for addressing certain of the deficiencies and/or limitations of the related art nanowire devices through the fabrication and use of a nanowire device that comprises core-shell nanowires whose density and position is controllable that can be produced in a simple manner.

Example embodiments provide a method for producing core-shell nanowires whose density and position is controllable in a simple manner.

Example embodiments also provide core-shell nanowires produced by the method.

In accordance with example embodiments, there is provided a method for producing core-shell nanowires, the method comprising the steps of:

(a) forming an insulating film on a substrate and patterning the insulating film;

(b) forming a plurality of nanowire cores in a direction perpendicular to the substrate on areas of the substrate from which portions of the insulating film are removed by the patterning; and (c) forming first nanowire shells on the surfaces of the nanowire cores.

Example embodiments include core-shell nanowires produced by the method according to example embodiments.

Example embodiments also include a nanowire device comprising a substrate, an insulating film formed on one surface of the substrate, a plurality of nanowire cores formed in a direction perpendicular to the substrate on areas of the substrate from which portions of the insulating film are removed by patterning, first nanowire shells formed on the surfaces of the nanowire cores, and electrode layers formed on the first nanowire shells.

BRIEF DESCRIPTION OF THE DRAWINGS

Example embodiments will be more clearly understood from the following detailed description taken in conjunction with the accompanying drawings.

FIG. 1 is a schematic view of a prior art device comprising core-shell nanowires;

FIG. 2 is a process flowchart illustrating a method for the production of nanowires and a method for the fabrication of a nanowire device comprising nanowires according to example embodiments;

FIG. 3 is process flowchart illustrating a method for producing nanowires by a vapor-liquid-solid (VLS) process in which a metal layer is formed before an insulating film is formed according to example embodiments;

FIG. 4 is a process flowchart illustrating a method for producing nanowires by a vapor-liquid-solid (VLS) process in which a metal layer is formed after an insulating film is formed according to example embodiments;

FIG. 5 is a process flowchart illustrating a method for fabricating a nanowire device in which a substrate is removed from the nanowires of FIG. 2 and electrodes are formed on the nanowires;

FIG. 6 is a process flowchart illustrating a method for producing nanowires in which undoped intrinsic portions as light-emitting layers are further formed between respective cores and first shells of the nanowires of FIG. 2;

FIG. 7 is a schematic view of an exemplary horizontal display device using nanowires according to example embodiments as light-emitting sources; and FIG. 8 is a schematic view of an exemplary vertical display device using nanowires according to example embodiments as light-emitting sources.

DESCRIPTION OF THE PREFERRED EMBODIMENTS

The present invention will now be described in greater detail with reference to the accompanying drawings.

Example embodiments are directed to a method for producing core-shell nanowires in which the contacts between lower surfaces of the nanowire cores and those of nanowire shells are blocked by a previously patterned insulating film.

Figure 1:
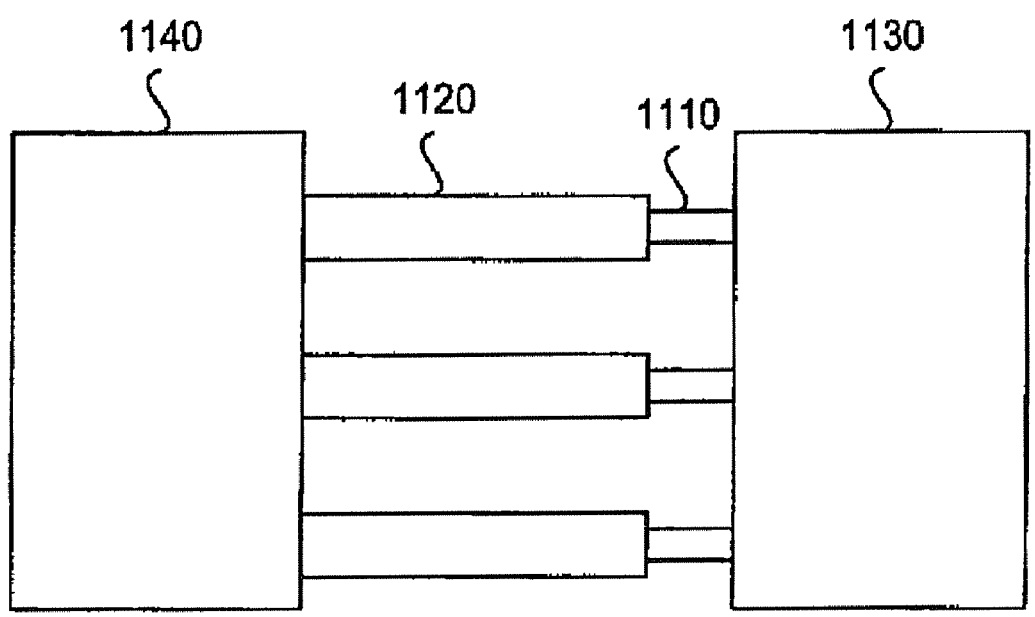
FIGS. 1-8 represent non-limiting, example embodiments as described herein.
Figure 2:
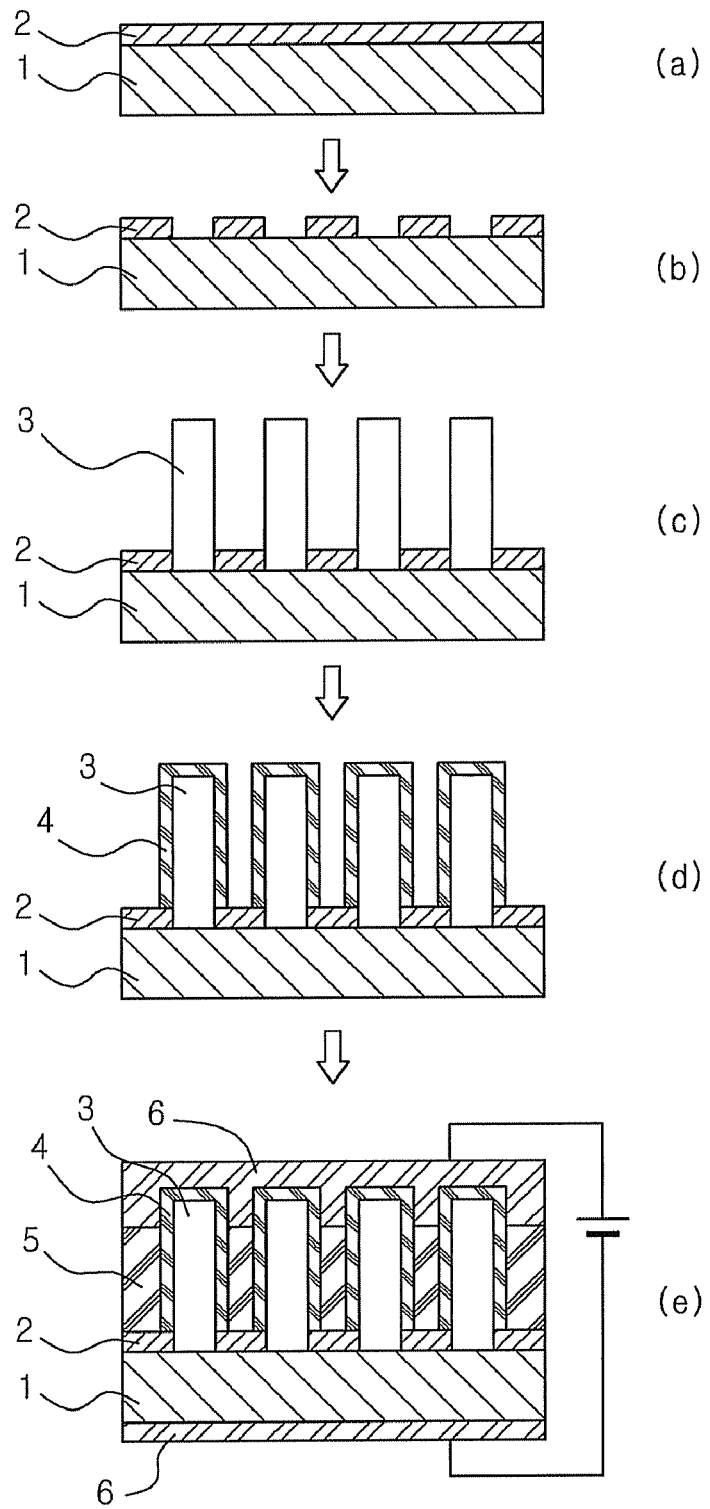

FIG. 2 is a process flowchart illustrating a method for the production of nanowires and a method for the fabrication of a nanowire device comprising nanowires according to example embodiments.

Referring to FIGS. 2a to 2e, an insulating film 2 is layered on top of a substrate 1 (FIG. 2a) and patterning is performed to remove portions of the insulating film 2 (FIG. 2b) (step (a)). Subsequently, a plurality of nanowire cores 3 are formed in a direction perpendicular to the substrate on areas of the substrate from which the portions of the insulating film are removed by the patterning (FIG. 2c, step (b)), and first nanowire shells 4 are formed on the surfaces of the nanowire cores 3 (FIG. 2d, step (c)) to produce core-shell nanowires. Furthermore, electrodes are formed on the core-shell nanowires to complete the fabrication of a nanowire device (FIG. 2e).

A detailed explanation of the respective steps of the method according to example embodiments will be given below.

(a) Formation of Patterned Insulating Film on Substrate

In this step, a patterned insulating film is formed on a substrate.

FIG. 2a is a cross-sectional view of a laminate of a substrate and an insulating film formed on the substrate, and FIG. 2b is a cross-sectional view of a patterned form of the insulating film 2 formed on the substrate 2.

The type of the substrate 1 may be a plastic or glass substrate, but is not particularly limited thereto. Examples of preferred materials for the substrate include, but are not limited to, silicon, sapphire, glass, silicon-coated glass, indium thin oxide, mica, graphite, molybdenum sulfide, metals, such as copper, zinc, aluminum, stainless steel, magnesium, iron, nickel, gold and silver, and plastics, such as polyimide, polyester, polycarbonate and acrylic resins.

Any suitable technique may be employed, without limitation, to pattern the insulating film. As described above, the insulating film may be laminated on the substrate, followed by patterning. Alternatively, an insulating film having a particular shape may be patterned on a substrate by a printing technique, such as screen printing, gravure printing or ink-jet printing.

Step (a) may include the sub-steps of layering an insulating film on a substrate (FIG. 2a) and patterning the insulating film to remove portions of the insulating film (FIG. 2b).

The removal of portions of the insulating film by patterning can be accomplished, without any particular limitation, by conventional techniques well known in the art. For example, a photoresist is applied to the insulating film and patterned by lithography. Other patterning techniques may be used instead of lithography.

It is preferred to apply a photoresist to the insulating film and pattern by lithography such that nanowires can be arranged at desired positions and density on the substrate in the subsequent steps.

This patterning technique will be explained in more detail below. First, a photosensitive photoresist composition is coated on the insulating film 2. Areas of the insulating film to be etched are selected. The selected areas are exposed to light and etched to remove exposed areas of the insulating film.

There is no particular restriction for the type of the photoresist composition and the exposure conditions.

The etching is performed, without any particular limitation, by a traditional technique, such as wet or dry etching.

The insulating film 2 may be formed of a common high-dielectric constant insulator. Specific examples of suitable insulators include, but are not limited to: ferroelectric insulators, such as $Ba_{0.33}Sr_{0.66}TiO_3$ (BST), $Al_2O_3$, $Ta_2O_5$, $La_2O_5$, $Y_2O_3$ and $TiO_2$; inorganic insulators, such as $PbZr_{0.33}Ti_{0.66}O_3$ (PZT) $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON; and organic insulators, such as polyimide, benzocyclobutene (BCB), parylene, polyacrylate, polyvinyl alcohol and polyvinyl phenol.

The insulating film 2 may have a thickness of 100 nm to 50 μm and preferably 500 nm to 10 μm. Below 100 nm, problems arise due to poor insulating properties and uniformity of the insulating film. Meanwhile, above 50 μm, problems arise during patterning of the insulating film.

Any coating technique may be employed to form the insulating film 2 on the substrate, and examples thereof include, but are not necessarily limited to, spin coating, dip coating, printing, spray coating and roll coating.

According to the method of example embodiments, portions of the insulating film 2 are removed by the patterning and nanowires are grown on areas of the substrate from which the portions of the insulating film are removed, so that the nanowires can be arranged at desired positions and density on the substrate 1. In addition, the contacts between cores and shells of the nanowires are partially blocked by the remaining portions of the insulating film 2. As a result, a vertical nanowire device can be fabricated without the need for complex processing steps, such as the separation, arrangement and etching of the nanowires. Furthermore, photonic crystal properties can be imparted to the nanowires by regularly controlling the intervals of the nanowires upon pattern formation, thus contributing to the amplification of particular wavelengths.

(b) Formation of Plurality of Nanowire Cores in Direction Perpendicular to the Substrate on Areas of the Substrate from which Portions of the Insulating Film are Removed by Patterning In this step, a plurality of nanowire cores are grown in a direction perpendicular to the substrate.

FIG. 2c is a cross-sectional view showing nanowire cores 3 formed vertically on the areas of the substrate 1 from which the portions of the insulating film 2 are removed.

The nanowire cores 3 may be made of a material selected from consisting of, but not limited to, Group II-IV, Group III-V, Group IV-VI, Group IV semiconductor compounds, and mixtures thereof.

The Group II-VI semiconductor compounds are selected from the group consisting of, but not necessarily limited to: binary compounds, e.g., CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V semiconductor compounds are selected from the group consisting of, but not necessarily limited to: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb and GaAlNP; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI semiconductor compounds are selected from the group consisting of, but not necessarily limited to: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV semiconductor compounds are selected from the group consisting of, but not necessarily limited to: unary compounds, e.g., Si and Ge; and binary compounds, e.g., SiC and SiGe.

Suitable processes for the formation of the nanowire cores 3 include, but not necessarily limited to, vapor phase-liquid phase-solid phase (VLS), solid-liquid-solid (SLS), metal organic chemical vapor deposition (MOCVD) and molecular beam epitaxy (MBE) processes.

FIG. 2 is a process flowchart illustrating a method for the production of nanowires according to example embodiments. According to the method, nanowires are formed without the use of any metal catalyst. An MOCVD or MBE process suitable for epitaxial growth of semiconductor materials is preferably employed to form nanowires.

Formation of Nanowires by Vapor-Liquid-Solid (VLS) Process

Hereinafter, the formation of nanowires according to example embodiments by a vapor-liquid-solid (VLS) process will be explained.

Figure 3:
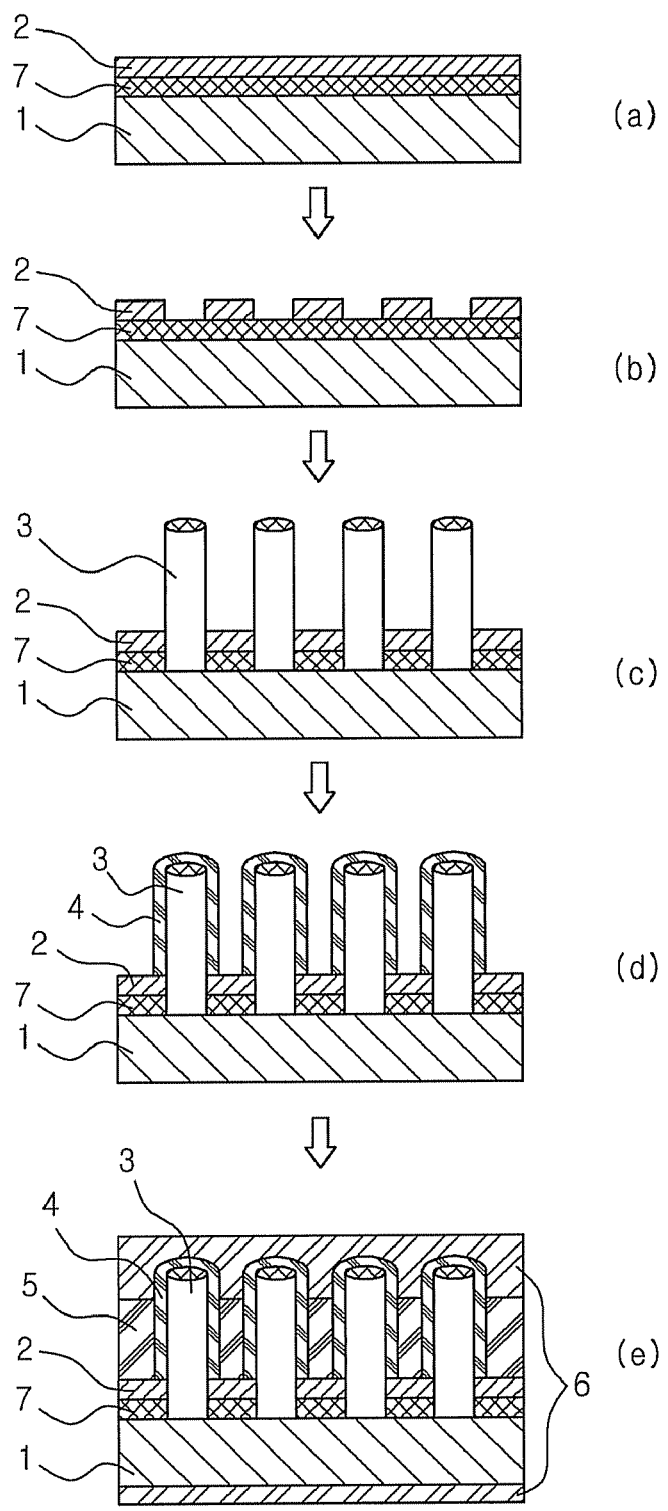
Figure 4:
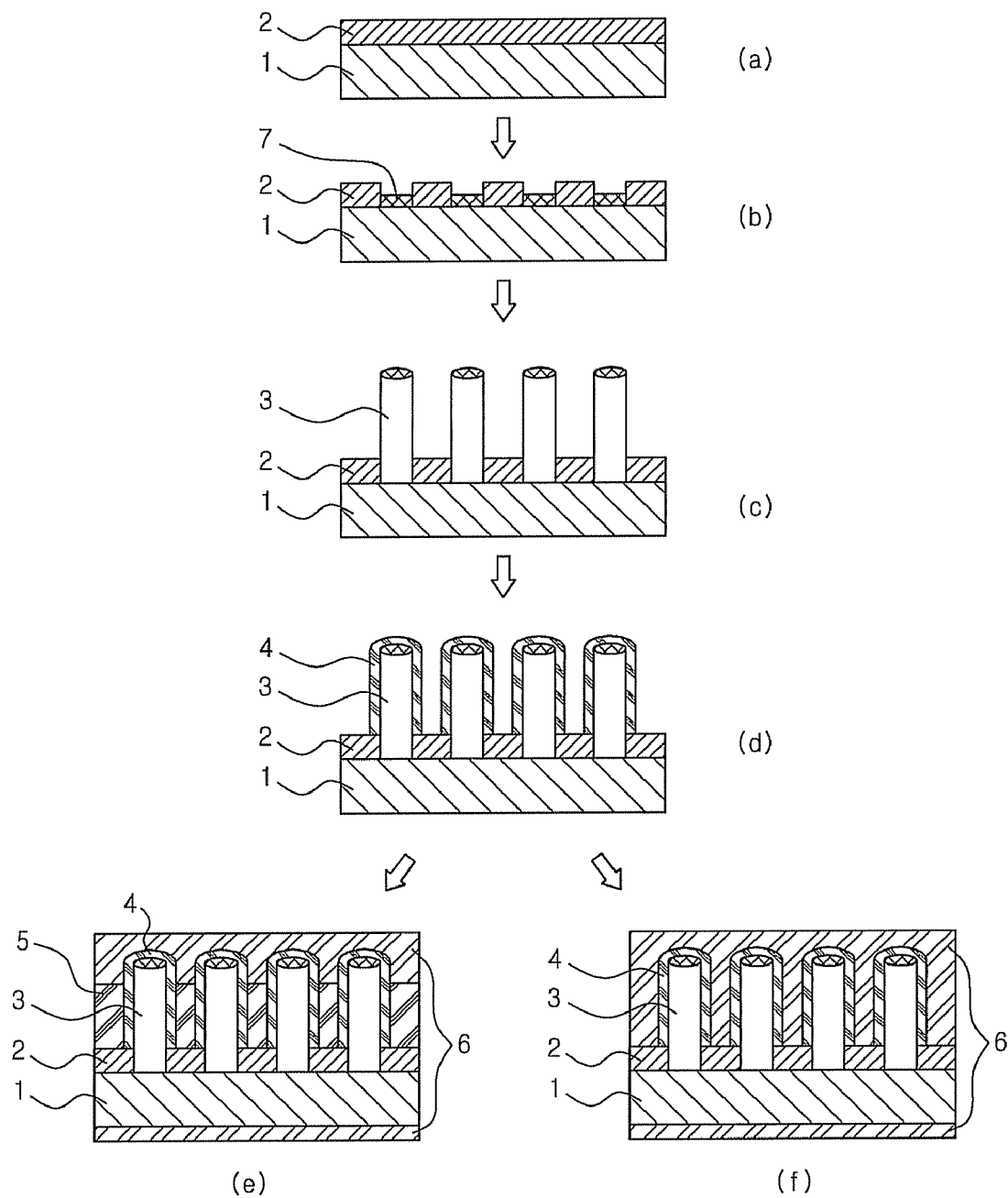

FIGS. 3 and 4 show process flowcharts illustrating the formation of nanowires by a vapor-liquid-solid (VLS) process.

According to the vapor-liquid-solid (VLS) process, a precursor for nanowires is put into a high-temperature furnace, condensed and crystallized on the surface of a molten catalyst (e.g., gold, cobalt or nickel), and grown into silicon nanowires.

Depending on the time when a metal layer is formed, the vapor-liquid-solid (VLS) process may be performed in different manners shown in FIGS. 3 and 4.

Referring to FIG. 3, a metal layer 7 is formed on a substrate 1 and an insulating film 2 is laminated on top of the metal layer 7 (FIG. 3a). Subsequently, portions of the insulating film are removed by patterning (FIG. 3b) and nanowire cores 3 are formed on areas of the substrate from which the portions of the insulating film are removed (FIG. 3c).

Referring to FIG. 4, a metal layer 7 is formed on areas of the substrate from which portions of the insulating film are removed after step (b) and nanowire cores are formed on the substrate 1 (FIG. 4c).

According to the vapor-liquid-solid (VLS) process, nanowires can be formed by putting the resulting substrate, on which the metal layer is formed, into a furnace and heating while feeding a gas and a precursor for the nanowires into the furnace.

The metal layer serves as a catalyst and may be formed of a metal selected from the group consisting of, but not limited to, Au, Ni, Ag, Pd, Pd/Ni, Ti, Co, Cr and Fe.

The gas used for the vapor-liquid-solid (VLS) process may be selected from the group consisting of Ar, $N_2$, He and $H_2$, but is not limited thereto. The flow rate of the gas is about 100 sccm and may be varied according to the type of processing.

The vapor-liquid-solid (VLS) process may be performed at a pressure or 760 torr less and between 370° C. and 800° C. The heating time may be varied depending on the length of nanowires to be formed.

As for silicon nanowires, the source fed for the vapor-liquid-solid (VLS) process may be $SiH_4$, $SiCl_4$, $SiH_2Cl_2$ or the like.

The metal catalyst coated on the substrate may be in the form of nanoparticles or a thin film. The thickness of the metal catalyst layer coated on the substrate is preferably not greater than 50 nm.

Any coating technique may be employed to coat the metal catalyst on the substrate so long as the objects of example embodiments are not impaired, and examples thereof include those known in the art, such as chemical vapor deposition (CVD), sputtering, E-beam evaporation, vacuum evaporation, spin coating and dipping.

The nanowires can be doped with a dopant to form a p-type or n-type doped nanowire cores. By varying the kind and the composition of materials, the nanowires may be formed to have a superlattice or hybrid composite structure.

After growth of the nanowire cores, the metal catalyst may be removed by known common methods. Particularly, selective removal of the metal catalyst can be accomplished in a chemical manner.

(c) Formation of First Nanowire Shells on the Surfaces of the Nanowire Cores

In this step, first nanowire shells are formed on the surfaces of the nanowire cores formed in step (b). As shown in FIG. 2d, first nanowire shells 4 can be grown on the surfaces of the nanowire cores 3. At this time, since the lower surfaces of the first nanowire shells are in contact with the upper surface of the insulating film 2, the first nanowire shells cannot be grown on the lower surfaces of the nanowire cores. For this reason, the contacts between the lower surfaces of the nanowire cores and those of the first nanowire shells are blocked by the patterned insulating film.

The first nanowire shells may be formed by the same method and using the same material as the nanowire cores formed in step (b).

The nanowire cores may be doped with a p-type or n-type dopant. The first nanowire shells and the nanowire cores are of different types, e.g., either p-type and n-type or p-type and n-type.

The cores and the first shells may be composed of the same material to produce homojunction nanowires. Alternatively, the cores and the first shells may be composed of different materials having different energy band gaps to produce heterostructure nanowires.

(d) Removal of the Substrate to Separate the Core-Shell Nanowires

If necessary, the substrate may be separated from the nanowires.

Figure 5:
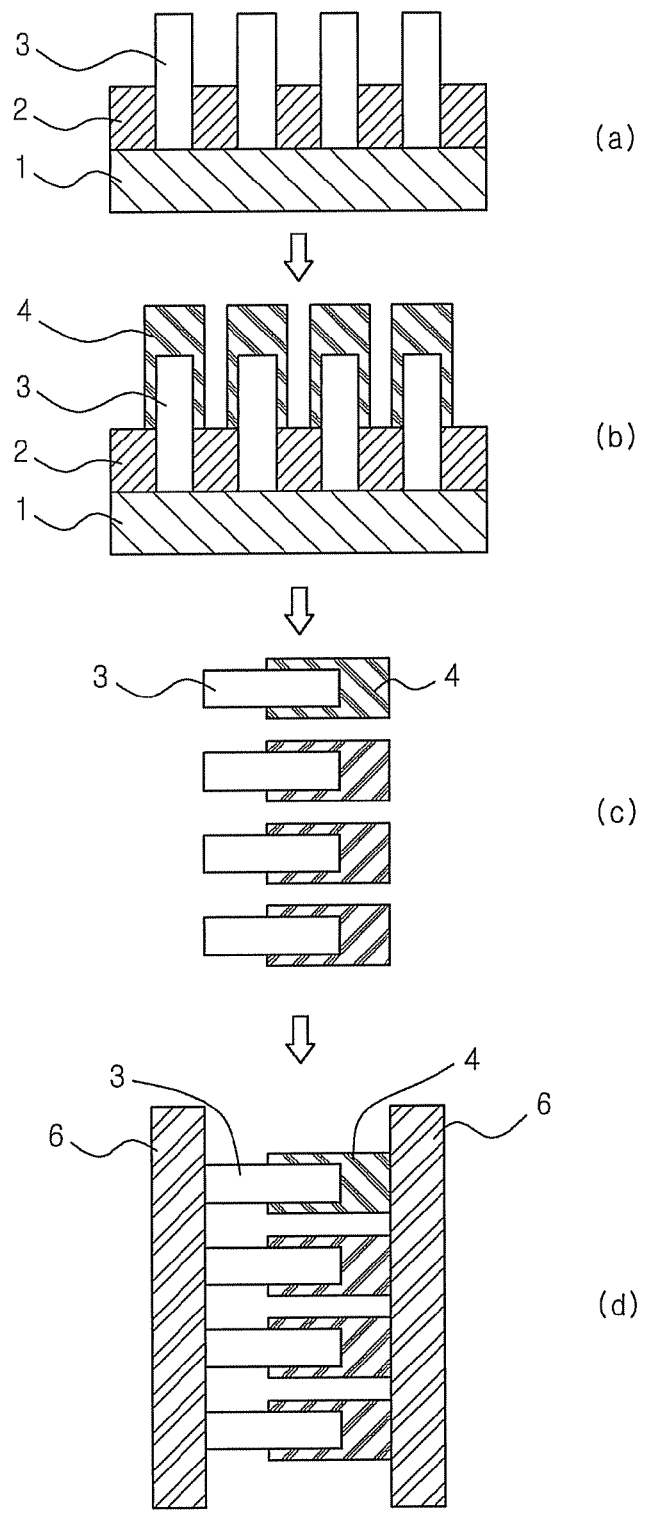

FIG. 5 is a process flowchart illustrating a method for fabricating a nanowire device. Specifically, the substrate is removed from the nanowires of FIG. 2 to obtain core-shell nanowires (FIG. 5c). The core-shell nanowires are arranged parallel to one another and electrode layers are formed thereon to fabricate a nanowire device (FIG. 5d).

Referring to FIG. 5, the core-shell nanowires separated from the substrate are arranged in a planar configuration and electrodes are adhered thereto to fabricate a nanowire device. The nanowire device may be used as a light-emitting or light-receiving source. Further, an electrode may be directly formed on the nanowire cores from which the substrate is removed to fabricate a horizontal nanowire device.

In the nanowire device comprising the nanowires, the contact surfaces between the nanowire cores and the first nanowire shells may be light-emitting layers.

To maximize light-emitting areas of the contact surfaces, intrinsic portions as light-emitting layers may be additionally formed between the nanowire cores and the first nanowire shells.

Figure 6:
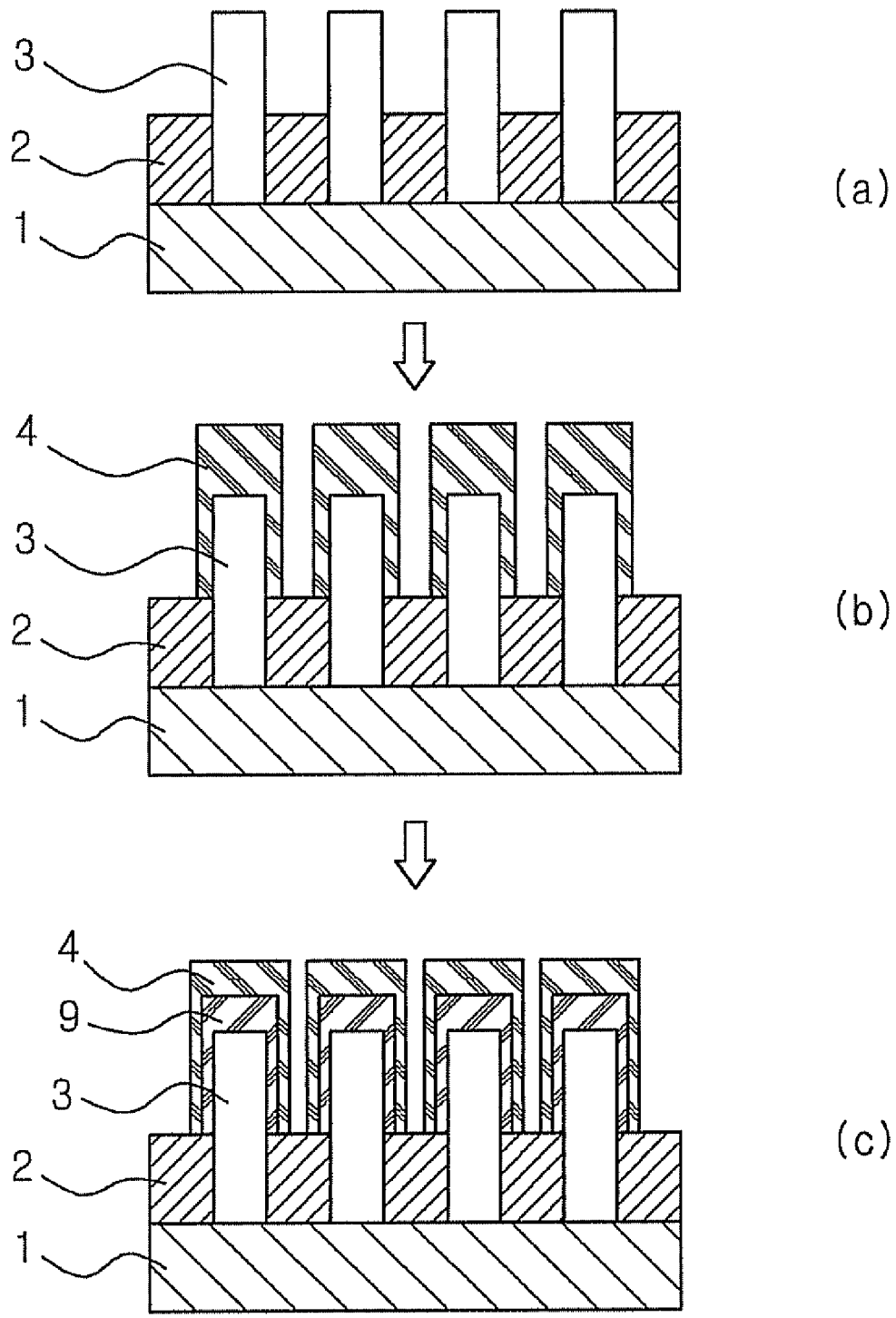

FIG. 6 is a process flowchart illustrating the formation of undoped intrinsic portions 9 as light-emitting layers between nanowire cores 3 and first nanowire shells 4 of the nanowires produced by the method of example embodiments. As shown in FIG. 6, after step (b), undoped intrinsic portions 9 as light-emitting layers are additionally formed on the surfaces of the nanowire cores 3, and the first nanowire shells formed in step (c) are formed on the surfaces of the intrinsic portions 9.

The intrinsic portions 9 may be called second nanowire shells. That is, the nanowires of example embodiments have a core-shell-shell structure comprising nanowire cores, second nanowire shells formed on the surfaces of the nanowire cores and first nanowire shells formed on the surfaces of the second nanowire shells. The second nanowire shells are intrinsic portions and an explanation thereof will be given in more detail below. In the case of nanowires composed of GaN nanowire cores and first nanowire shells, InGaN or AlGaN intrinsic portions are interposed as intermediate cells between the cores and the shells. The intrinsic portions are responsible for actual light emission. Therefore, the second nanowire shells are formed by allowing a material lattice-matched with both cores and shells to grow.

The light emission in the intrinsic portions will be better understood from the following brief description. When the cores are of p-type and the first shells are of n-type, the intrinsic portions have a higher valence band than the cores and a lower conduction band than the first shells. As a result, a quantum well structure is achieved. The luminescence efficiency of the nanowires is increased only when the intrinsic portions having a quantum well structure are formed in the nanowires. That is, holes injected from the cores and electrons injected from the first shells combine with one another in the intrinsic second shells to emit light.

The second nanowire shells serving as light-emitting layers can be formed using the same material and method as those used for the formation of the first nanowire shells. The only difference is that the second nanowire shells 9 are not doped with a dopant.

Example embodiments are directed to core-shell nanowires produced by the method of example embodiments.

Example embodiments are directed to a device comprising the core-shell nanowires of example embodiments.

FIGS. 2e, 3e, 4e, 5d, 7 and 8 are schematic views of exemplary devices comprising the nanowires produced by the method of example embodiments.

Referring to FIGS. 2e, 3e and 4e, each of the devices comprises a substrate 1, an insulating film 2 formed on one surface of the substrate, a plurality of nanowire cores 3 in a direction perpendicular to the substrate on areas of the substrate from which portions of the insulating film are removed by patterning, first nanowire shells 4 formed on the surfaces of the nanowire cores, and electrode layers 6 formed on the first nanowire shells.

Figure 7:
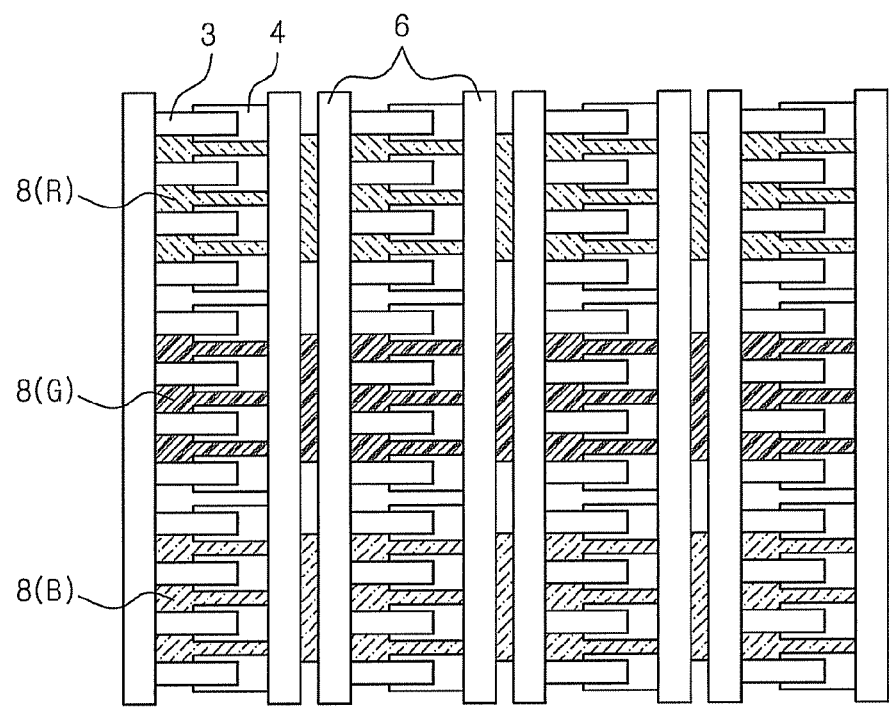

Referring to FIGS. 5d and 7, each of the devices comprises a plurality of nanowire cores 3 arranged parallel to one another, first nanowire shells 4, and electrode layers 6 formed on the respective nanowire cores and shells.

The device of example embodiments may further comprise a filler 5 between the first nanowire shells. Each of devices shown in FIGS. 2e, 3e, 4e and 8 further comprises a filler. In the device shown in FIG. 4f, the electrode layers are formed on the first nanowire shells without the formation of any filler. As the filler 5, any organic or inorganic insulator may be used without particular limitation.

Non-limiting examples of the device include electronic devices, such as field effect transistors (FETs), sensors, photodetectors, light-emitting diodes (LEDs), laser diodes (LDs), electroluminescence (EL) devices, photoluminescence (PL) devices, and cathodeluminescence (CL) devices.

Electrodes can be deposited on the first nanowire shells of the core-shell nanowires of example embodiments to fabricate a nanowire device that can be operated at high efficiency.

The device may comprise electrode layers formed on the respective substrate and the first nanowire shells.

Alternatively, the device may comprise electrode layers formed on the respective nanowire cores and the first nanowire shells after removal of the substrate.

A color filter may be provided to the device to fabricate a red (R), green (G), blue (B) or white light emitting device.

Figure 8:
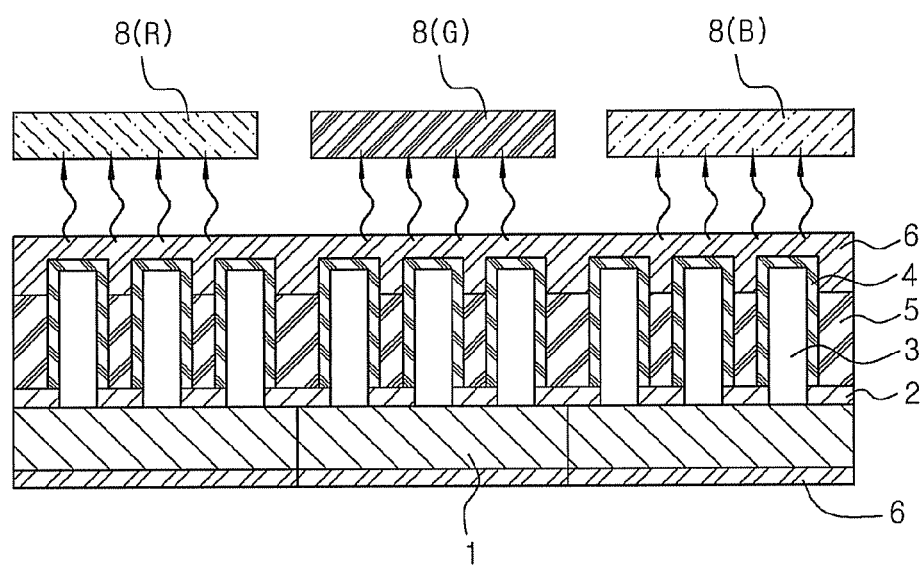

The nanowires of the device may be as light emitting sources. As shown in FIGS. 7 and 8, color-converting materials 8R, 8G and 8B, such as phosphors, are positioned on light-emitting planes to fabricate a red (R), green (G) and blue (B) display device or a white light emitting source.

Since the vertical lateral surfaces of the nanowires of the device have a p-n junction structure, the area of diodes dramatically increases in the lengthwise direction of the nanowires. Therefore, the device can emit light with high luminance.

In addition to these devices, p/n diodes or nanowire materials composed of semiconductor materials with different energy bands can be arranged in a two dimensional configuration to fabricate photo diodes, such as EL driving devices and solar cells.

Hereinafter, example embodiments will be explained in more detail with reference to the following examples. However, these examples are given for the purpose of illustration only and are not intended to limit example embodiments.

EXAMPLES

Example 1

Production of Silicon Nanowires

A natural oxide film of an electrically conductive silicon substrate was removed by cleaning with an organic solvent and hydrofluoric acid. Gold (Au) nanoparticles (Nipponpaint) as catalysts were spin-coated or E-beam deposited on the clean silicon substrate to form a thin film having a thickness of about 30 nm. A $SiO_2$ oxide film was deposited to a thickness of 1 μm on the thin film. Thereafter, a photoresist (AZ-1512, Clariant) was spin-coated on the $SiO_2$ oxide film, exposed to light using a UV-exposure system (Oriel) as a light source through a photomask, and developed to form a pattern. The exposed areas of the $SiO_2$ oxide film, from which the photoresist was removed, were etched with a hydrofluoric acid solution to expose areas of the catalyst layer. Subsequently, the resulting structure was put into a furnace and heating at a rate of 10-15° C./min. while feeding diluted $SiH_4$ as a precursor for nanowires and $BH_3$ as a dopant at a flow rate of 100 sccm. At this time, the processing pressure was maintained at 500 torr. Nanowire cores were allowed to grow while maintaining a processing temperature of 500° C. for 30 minutes. Then, the gas feeding was stopped to quench the growth of the nanowires. Next, diluted $SiH_4$ as a precursor for nanowires and $P_2H_5$ as a dopant were fed into the furnace to grow first nanowire shells. The growth of the first nanowire shells was conducted in the same manner as the growth of the nanowire cores.

Example 2

Fabrication of Vertical EL Light Emitting Device

A vertical EL light emitting device was fabricated by filling polyimide as an insulating material between the nanowires produced in Example 1 and forming ITO electrode layers on top of the first nanowire shells.

Example 3

Fabrication of Horizontal EL Light Emitting Device

A horizontal EL light emitting device was fabricated by removing the substrate from the nanowires produced in Example 1 to leave the nanowires only, arranging the nanowires parallel to one another, and adhering electrodes to the nanowires.

According to the method of exemplary embodiments, coreshell nanowires whose density and position is controllable can be produced in a simple manner. The vertical arrangement of the nanowires in a three dimensional array leads to an increase in light emitting/receiving area, which enables the fabrication of high-luminance and high-efficiency devices. In addition, the intervals of the nanowires can be controlled to achieve photonic crystal effects.

Example embodiments have been described in detail with reference to the foregoing preferred embodiments. However, example embodiments are not limited to the preferred embodiments. Those skilled in the art will appreciate that various modifications and variations are possible, without departing from the scope and spirit of the appended claims. Accordingly, such modifications and variations are intended to come within the scope of the claims.

What is claimed is:

1. A method for producing core-shell nanowires, the method comprising the steps of:
   (a) forming a metal layer directly on a substrate;
   (b) forming an insulating film on the metal layer;
   (c) patterning the insulating film;
   (d) forming a plurality of nanowire cores in a direction perpendicular to the substrate on areas of the substrate from which portions of the insulating film are removed by the patterning; and
   (e) forming first nanowire shells on surfaces of the nanowire cores to produce the core-shell nanowires.

2. The method according to claim 1, further comprising the step of removing the substrate after step (e).

3. The method according to claim 1, wherein, in step (e), the lower surfaces of the first nanowire shells are in contact with the upper surface of the insulating film, and the contacts between the lower surfaces of the nanowire cores and those of the first nanowire shells are blocked by the insulating film.

4. The method according to claim 1, wherein the substrate is made of a material selected from the group consisting of silicon, sapphire, glass, silicon-coated glass, indium thin oxide, mica, graphite, molybdenum sulfide, metals, including copper, zinc, aluminum, stainless steel, magnesium, iron, nickel, gold and silver, and plastics, including polyimide, polyester, polycarbonate and acrylic resins.

5. The method according to claim 1, wherein the patterning of the insulating film includes applying a photoresist to the insulating film and patterning the photoresist by lithography.

6. The method according to claim 1, wherein the patterning of the insulating film includes coating a photosensitive photoresist composition on the insulating film, selectively exposing areas of the insulating film to be etched to light, and etching the exposed areas of the insulating film.

7. The method according to claim 1, wherein the insulating film is formed of an insulator selected from the group consisting of: ferroelectric insulators, including $Ba_{0.33}Sr_{0.66}TiO_3$ (BST), $Al_2O_3$, $Ta_2O_5$, $La_2O_5$, $Y_2O_3$ and $TiO_2$; inorganic insulators, including $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_X$ and AlON; and organic insulators, including polyimide, benzocyclobutene (BCB), parylene, polyacrylate, polyvinyl alcohol and polyvinyl phenol.

8. The method according to claim 1, wherein the insulating film has a thickness of 100 nm to 50 μm.

9. The method according to claim 1, wherein the insulating film is layered on the metal layer by a coating technique selected from the group consisting of spin coating, dip coating, printing, spray coating and roll coating.

10. The method according to claim 1, wherein the nanowires are made of a material selected from the group consisting of Group II-IV, Group III-V, Group IV-VI, Group IV semiconductor compounds, and mixtures thereof.

11. The method according to claim 1, wherein the Group II-VI semiconductor compounds are selected from the group consisting of binary compounds, including CdSe, CdTe, ZnS, ZnSe, ZnTe, ZnO, HgS, HgSe and HgTe, ternary compounds, including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe, and quaternary compounds, including CdZnSeS, CdZnSeTe, CdZnSTe, CdHgSeS, CdHgSeTe, CdHgSTe, HgZnSeS, HgZnSeTe and HgZnSTe; the Group III-V semiconductor compounds are selected from the group consisting of binary compounds, including GaN, GaP, GaAs, GaSb, AlN, AlP, AlAs, AlSb, InN, InP, InAs and InSb, ternary compounds, including GaNP, GaNAs, GaNSb, GaPAs, GaPSb, AlNP, AlNAs, AlNSb, AlPAs, AlPSb, InNP, InNAs, InNSb, InPAs, InPSb and GaAlNP, and quaternary compounds, including GaAl-NAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb; the Group IV-VI semiconductor compounds are selected from the group consisting of binary compounds, including SnS, SnSe, SnTe, PbS, PbSe and PbTe, ternary compounds, including SnSeS, SnSeTe, SnSTe, PbSeS, PbSeTe, PbSTe, SnPbS, SnPbSe and SnPbTe, and quaternary compounds, including SnPbSSe, SnPbSeTe and SnPbSTe; and the Group IV semiconductor compounds are selected from the group consisting of unary compounds, including Si and Ge, and binary compounds, including SiC and SiGe.

12. The method according to claim 1, wherein the nanowire cores or the first nanowire shells are formed by a process selected from the group consisting of vapor phase-liquid phase-solid phase (VLS), solid-liquid-solid (SLS), metal organic chemical vapor deposition (MOCVD) and molecular beam epitaxy (MBE) processes.

13. A method for producing core-shell nanowires, the method comprising the steps of
(a) forming an insulating film on a substrate,
(b) patterning the insulating
(c) forming a metal layer on areas of the substrate from which portions of the insulating film are removed by the patterning
(c) forming a plurality of nanowire cores on the substrate and in a direction perpendicular to the substrate on areas of the substrate from which portions of the insulating film are removed by the patterning; and
(d) forming first nanowire shells on surfaces of the nanowire cores to produce the core-shell nanowires.

14. The method according to claim 1, wherein the nanowires are formed by putting the substrate, on which the metal layer is formed, into a furnace and heating while feeding a gas and a precursor for the nanowires into the furnace.

15. The method according to claim 1, wherein the metal layer is formed of a metal selected from the group consisting of Au, Ni, Ag, Pd, Pd/Ni, Ti, Co, Cr and Fe.

16. The method according to claim 1, wherein the nanowire cores are doped with a p-type or n-type dopant in step (b) and the first nanowire shells are doped with an n-type or p-type dopant in step (c).

17. The method according to claim 1, wherein the contact surfaces between the nanowire cores and the first nanowire shells are light-emitting layers.

18. A method for producing core-shell nanowires, the method comprising the steps of:
(a) forming an insulating film on a substrate,
(b) patterning the insulating film;
(c) forming a plurality of nanowire cores in a direction perpendicular to the substrate on areas of the substrate from which portions of the insulating film are removed by the patterning;
(d) forming undoped intrinsic portions as light-emitting layers on surfaces of the nanowire cores; and
(e) forming first nanowire shells on surfaces of the intrinsic portions to produce the core-shell nanowires.

19. The method according to claim 17, wherein the intrinsic portions are formed as second nanowire shells.

20. The method according to claim 19, wherein the second nanowire shells are formed by allowing a material lattice-matched with both nanowire cores and nanowire shells to grow.

21. A core-shell nanowire produced by the method according to claim 1.

22. A nanowire device comprising:
a substrate,
metal layer on one surface of the substrate,
an insulating film on a surface of the metal layer,
a plurality of nanowire cores disposed in a direction perpendicular to the substrate on areas of the substrate from which portions of the insulating film are removed by patterning,
first nanowire shells disposed on surfaces of the nanowire cores, and
electrode layers disposed on the first nanowire shells.

23. A nanowire device comprising nanowires produced by the method according to claim 1.

24. The nanowire device according to claim 22, wherein the device is selected from the group consisting of electronic devices, sensors, photodetectors, light-emitting diodes (LEDs), laser diodes (LDs), electroluminescence (EL) devices, photoluminescence (PL) devices, and cathodeluminescence (CL) devices.

25. The nanowire device according to claim 22, wherein the device is equipped with a color filter to fabricate a red (R), green (G), blue (B) or white light emitting device.

26. The nanowire device according to claim 22, further comprising a filler between the first nanowire shells.

27. The nanowire device according to claim 26, wherein the filler is an organic or inorganic insulator.

28. The nanowire device according to claim 22, further comprising electrode layers formed on the substrate or the nanowire cores and the first nanowire shells.

29. The method according to claim 13, wherein the forming a plurality of nanowire cores comprises
disposing the substrate, on which the metal layer is formed, into a furnace, and
heating while feeding a gas and a precursor for the nanowires into the furnace.

30. The method according to claim 13, wherein the metal layer comprises a metal selected from the group consisting of Au, Ni, Ag, Pd, Pd/Ni, Ti, Co, Cr and Fe.

31. The method of claim 1, wherein the metal layer comprises a metal selected from the group consisting of Au, Ni, Ag, Pd, Pd/Ni, Ti, Co, Cr, and Fe.

32. A nanowire device comprising:
a substrate,
a patterned insulating film disposed on a surface of the substrate,
a plurality of nanowire cores disposed in a direction perpendicular to the substrate on areas of the substrate from which portions of the insulating film are removed by the patterning,
a metal layer on the plurality of nanowire cores,
first nanowire shells disposed on surfaces of the nanowire cores, and
electrode layers disposed on the first nanowire shells.

33. A nanowire device comprising:
a substrate,
a patterned insulating film disposed on a surface of the substrate,
a plurality of nanowire cores disposed in a direction perpendicular to the substrate on areas of the substrate from which portions of the insulating film are removed by the patterning,
undoped intrinsic portions on surfaces of the nanowire cores,
first nanowire shells disposed on surfaces of the undoped intrinsic portions, and
electrode layers disposed on the first nanowire shells.

* * * * *